United States Patent [19]

Davies

[11] Patent Number: 4,724,465
[45] Date of Patent: Feb. 9, 1988

[54] PHOTOFABRICATION USING LASER LIGHT TO EXPOSE PHOTORESIST

[75] Inventor: Howard J. Davies, Kingston-upon-Thames, United Kingdom

[73] Assignee: NPM International, London, England

[21] Appl. No.: 945,696

[22] Filed: Dec. 23, 1986

[30] Foreign Application Priority Data

Dec. 30, 1985 [GB] United Kingdom ................ 8531830

[51] Int. Cl.[4] ............................................. G03B 27/42
[52] U.S. Cl. ........................................ 355/53; 355/77
[58] Field of Search ............ 355/53, 133, 77, 125–127; 354/4

[56] References Cited

U.S. PATENT DOCUMENTS

| | | | |
|---|---|---|---|
| 3,668,990 | 6/1972 | Hayes | 354/4 |
| 3,732,796 | 5/1973 | Marcy | 354/4 |
| 3,833,298 | 9/1974 | Abita et al. | 355/125 |
| 4,419,675 | 12/1983 | Neumann et al. | 354/4 X |
| 4,504,144 | 3/1985 | Trost | 355/53 X |

Primary Examiner—L. T. Hix
Assistant Examiner—D. Rutledge
Attorney, Agent, or Firm—Shoemaker and Mattare, Ltd.

[57] ABSTRACT

A method and apparatus are provided for photofabrication on a three-dimensional solid surface using a laser light beam (2) which is projected onto the surface which has previously been coated with photoresist. Mechanism (8, 9) is provided for moving the workpiece (3) so that all those parts of the photoresist layer are brought in turn into the exposure position. The photoresist is subsequently chemically developed to provide a patterned area of exposed underlying surface for further additive or subtractive physical or chemical processing. One of many applications would be the production of non-planar printed circuit boards for electronic applications.

8 Claims, 1 Drawing Figure

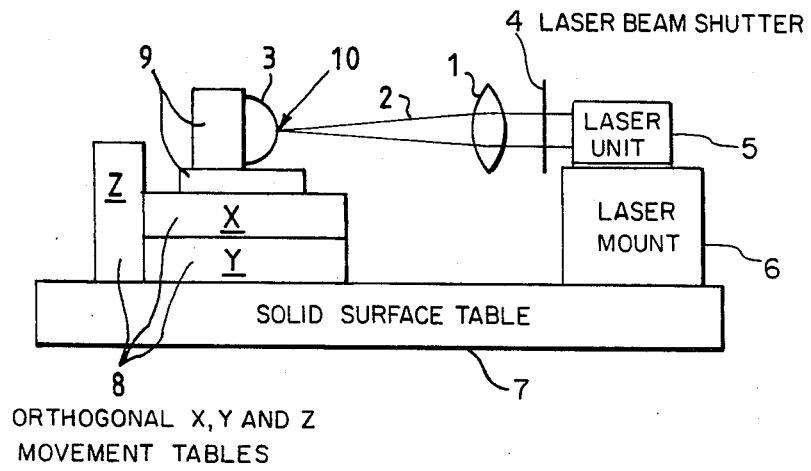

PHOTOFABRICATION USING LASER LIGHT TO EXPOSE PHOTORESIST

This invention relates to the photofabrication of a pattern onto a solid photoresist-coated surface using a beam of laser directed onto it. The beam is caused to travel across its surface in a controlled manner in order to give rise to a pattern and to induce the desired level of photographic exposure.

Photofabrication using light-sensitive chemical resists is well known technology. Normally, the technique is to apply photoresist to a surface to be patterned and to expose the photoresist to an ultra-violet light source through a photographic pattern mask. The photoresist is afterwards chemically developed to remove exposed (or unexposed) photoresist to leave a positive (or negative) development which corresponds to the mask pattern. The areas where the resist has been completely removed are commonly referred to as windows.

Subsequent processes directed to the surface revealed through the resist widows are either additive or subtractive. Metal evaporation, sputtering, ion implanation and chemical- or electro-plating are examples of additive processes. Etching is an example of a subtractive process. These processes of photoresist exposure, development, with additive and subtractive treatments, are often repeated several times and in many permutations.

Current use of photographic pattern masks is largely confined to flat surfaces (as for example, in the manufacture of printed circuit boards). The use of photographic masks for pattern exposure of photoresist on three-dimensional methods are often used (as for example, transfer of the pattern from a flexible transfer film onto a curved surface).

This invention is based on the realization that a photographic mask is not required to produce a light exposure pattern on the photoresist. Instead, a beam of light produced by a suitable laser is directed at the photoresist-coated surface (hereinafter referred to as the workpiece) to effect its exposure. Relative motion between the workpiece and the impinging light beam is controlled to produce the desired pattern.

Accordingly, in a first aspect, the invention provides a method of forming a pattern of resist on a surface of a workpiece extending in three dimensions whose surface has been coated with a layer of photoresist material which is sensitive to light including the steps of selectively directing a beam of light from a laser light source to an exposure position; and moving the workpiece in such a manner that all those parts of the photoresist layer to be exposed to light are brought in turn into said exposure position. The exposed layer of photoresist can then be chemically developed to produce a required pattern.

In a second aspect the invention provides apparatus for forming a pattern of photoresist on a surface of a workpiece extending in three dimensions including a laser light source for directing a light beam to an exposure position; means for mounting a workpiece having a surface extending in three dimensions and coated with a layer of unexposed photoresist; and means operable to move the workpiece to bring selected areas of the resist layer into the exposure position for exposure by the light beam.

The use of a laser has the advantages firstly that a focused beam of very high intensity can be produced on the workpiece, secondly that rapid relative movements between workpiece and the spot image can be used whilst producing satisfactory exposure of the layer of resist, thirdly that the optics required are less bulky and hence more manoeuverable, and fourthly that a very high resolution can be achieved with appropriate choice of photoresist and optical elements. The beam of light from a laser is nondivergent, and therefore, there is no need to position the laser close to the workpiece, a separation e.g. of 200 mm being quite satisfactory. The physical design of the apparatus is therefore not constrained by this consideration.

The relative motion can be produced in several ways: (1) by movement of the laser assembly; (2) by the use of a movable light reflector or refractor, or (3) by movement of the workpiece.

The laser beam may be used focussed or unfocussed according to the size, shape, degree of pattern-accuracy and level of exposure required. By "a suitable laser" in the aforementioned is meant, a laser which produces light of a wavelength capable of inducing the necessary chemical change to effect an exposure which can be chemically developed in the particular photoresist, an argon ion gas laser that produces a beam in the near ultraviolet (458 mm) having been used to image a typical photoresist.

One of the main advantages of this invention is that it enables highly accurate light exposure patterns to be written directly onto the surfaces of three-dimensional surfaces, previously coated with photoresist. The relative motion of the workpiece and the impinging laser light beam can be accomplished conveniently using computer-controlled movement of the workpiece which is attached to the stage of a conventional computerized numerical control machining centre having three translational and two rotational degrees of freedom (or fewer as required by the particular application). Most CNC machines work by instructions downloaded from magnetic tape or disc, and these instructions can be produced off-line manually or more usually on a computer; the use of a computer directly coupled to the CNC machine is not excluded.

An embodiment of the invention will now be described, by way of example only, with reference to the accompanying drawing, which is a diagrammatic side view of a machine for forming a pattern of photoresist on a surface of a workpiece extending in three dimensions.

In the drawing, an enclosure such as a darkroom fitted with appropriate photographic safety lighting to remove frequencies to which the photoresist is sensitive houses a solid surface table 7 carrying a mounting 6 for a laser light source 5 that projects a coherent light beam 2. A shutter 4 for interrupting the beam 2 may be located outside the resonant cavity of the laser 5 as shown or may be located inside the cavity. The beam 2 is directed towards a workpiece 3 that is supported on the table 7 firstly by three movement tables 8 providing for independent translational movement along orthogonal X, Y and Z axes and secondly by two movement tables 9 providing for independent rotational movement about vertical and horizontal axes. A fixed lens 1 is used to focus or partially focus the beam 2 into an image 10 on the workpiece 3 which is shown, for the purposes of illustration only, as spherical.

Exposure of the photoresist on the workpiece 3 is achieved by opening the shutter 4 and by appropriate computer-controlled movement of the workpiece 3 via the workcentre 8, 9 to effect the desired pattern shape, resolution and level of exposure. To achieve this, a CNC controller governs the distance of the workpiece 3 from the lens 1, the angle of incidence of the beam 2 on the workpiece 3 (hence beam image size and intensity) and the surface velocity of the beam image 10 on the workpiece 3. In this configuration, the beam image 10 on the workpiece 3 may be formed in front of or behind the focal point of the lens 1, depending upon the size of the spot of light that it is desired to produce and the workpiece 3, or it may be formed at the focus of the lens 1. In some applications, the lens may be removed entirely to use the laser beam unfocussed or it may be replaced by an iris or another optical device. Compound lenses and systems of lenses of any geometry may be used for focussing or beamshaping and when required, attenuating filters and irises may also be used in any permutation.

The facility provided by this invention is an exposure of the photoresist which can be chemically developed to produce access to the surface of the workpiece via the pattern windows thus created, in order to follow with an additive or subtractive chemical or physical process upon that surface. Typical applications are the electro- or electroless-plating of metal, or etching of a metalised plastic polymer surface to produce electrically conductive track resulting in a non-planar printed circuit board for use in electronic and electrical applications. Other uses for this invention, for example, are the production of non-planar microwave antenna elements for radar and communication applications. Yet another application is for the pattern-etching of glass products and metal articles such as nameplates. These are illustrative of the many hundreds of uses to which this invention may be put.

I claim:

1. A method of forming a pattern of resist on a surface of a workpiece defining a three-dimensional space, the method including the steps of:
    coating said surface with a layer of photoresist which is sensitive to light;
    mounting said workpiece on a support with said coated surface of said three-dimensional surface exposed;
    selectively directing a beam of light from a laser light source to an exposure position; and
    moving said support to bring all those parts of said photoresist on said three-dimensional surface to be exposed to light in turn into said exposure position with said workpiece remaining fixed to said support.

2. A method as claimed in claim 1, in which the light beam is selectively controlled by shutter means so as to expose only selected areas of the resist to the light beam.

3. A method as claimed in claim 1, in which the movement of the workpiece comprises translation in three mutually perpendicular directions and rotation about two mutually perpendicular axes.

4. A method as claimed in claim 1, in which the movement of the workpiece is so controlled as to produce a desired relative velocity between the surface of the workpiece and the light beam.

5. Apparatus for forming a pattern of photoresist on a surface of a workpiece extending in three dimensions, the apparatus including:
    a laser light source for directing a laser light beam to an exposure position;
    a support for holding a workpiece having a surface which extends in three dimensions and which is coated with a layer of unexposed photoresist, said workpiece being held on said support for said three-dimensional coated surface to be exposed to said exposure position; and
    means operable to move said support to bring all parts of said three-dimensional coated surface in succession to said exposure position.

6. Apparatus as claimed in claim 5, including shutter means operable to control the light beam.

7. Apparatus as claimed in claim 5, in which the means for moving the workpiece comprises first means for translating the workpiece selectively in three mutually perpendicular directions and second means for rotating the workpiece about two mutually perpendicular axes.

8. Apparatus as claimed in claim 5, in which the means for moving the workpiece is controlled by a computer.

* * * * *